(12) United States Patent
Kälvesten et al.

(10) Patent No.: US 7,067,345 B2
(45) Date of Patent: Jun. 27, 2006

(54) METHOD OF JOINING COMPONENTS

(76) Inventors: Edvard Kälvesten, Edelcrantzvägen 20, 129 38 Hägersten (SE); Göran Stemme, Ruddammsvägen 31B, 114 21 Stockholm (SE); Frank Niklaus, Fleminggatan 25 bv, 112 26 Stockholm (SE)

( * ) Notice: Subject to any disclaimer, the term of this patent is extended or adjusted under 35 U.S.C. 154(b) by 422 days.

(21) Appl. No.: 10/181,146

(22) PCT Filed: Jan. 17, 2001

(86) PCT No.: PCT/SE01/00078

§ 371 (c)(1),
(2), (4) Date: Jan. 6, 2003

(87) PCT Pub. No.: WO01/54189

PCT Pub. Date: Jul. 26, 2001

(65) Prior Publication Data

US 2003/0102079 A1    Jun. 5, 2003

(30) Foreign Application Priority Data

Jan. 17, 2000   (SE) .................................. 0000148

(51) Int. Cl.
  *H01L 21/30* (2006.01)

(52) U.S. Cl. .................. 438/55; 438/455; 438/459
(58) Field of Classification Search ................ 438/455
  See application file for complete search history.

(56) References Cited

U.S. PATENT DOCUMENTS

| 5,557,120 A | 9/1996 | Martin et al. |
| 5,959,340 A | 9/1999 | Wan et al. |
| 6,287,940 B1 * | 9/2001 | Cole et al. .................. 438/455 |

* cited by examiner

*Primary Examiner*—Thanh Nguyen
(74) *Attorney, Agent, or Firm*—Young & Thompson

(57) ABSTRACT

A method of combining components to form an integrated device, wherein the components are provided on a first sacrificial wafer, and a second non-sacrificial wafer, respectively. The sacrificial wafer carries a first plurality of components and the non-sacrificial wafer carries a second plurality of components. The wafers are bonded together with an intermediate bonding material. Optionally the sacrificial wafer is thinned to a desired level. The components of the sacrificial wafer are electrically interconnected to the component(s) on the non-sacrificial wafer. Finally, optionally the intermediate bonding material is stripped away.

20 Claims, 9 Drawing Sheets (e)

(f)

(g)

(h)

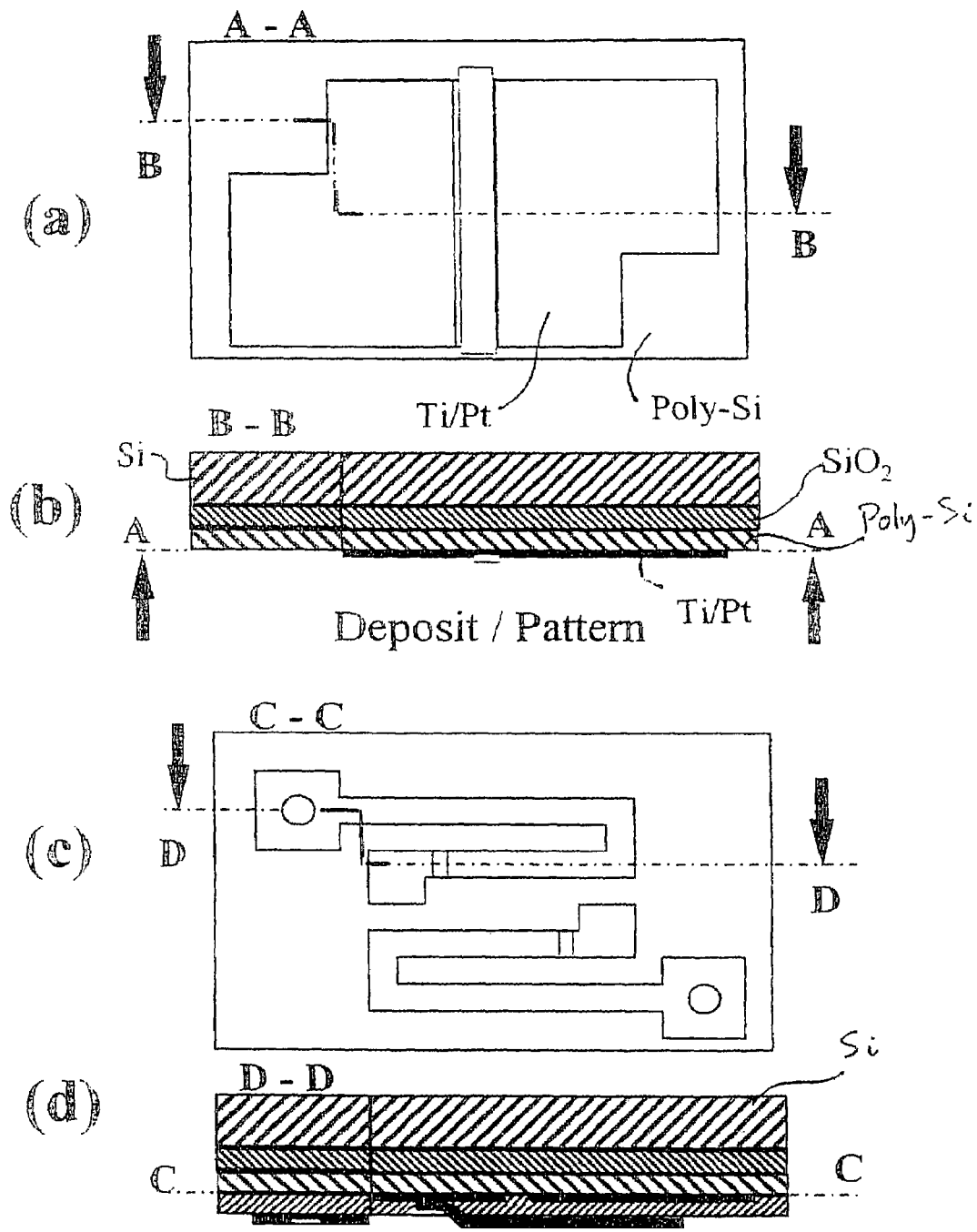
Fig. 5    Etch / Deposit / Pattern

METHOD OF JOINING COMPONENTS

The present invention relates to generally to a method of manufacturing an integrated micro electronic device (e.g. a semi-conductor device), comprising transferring structures from a first substrate (e.g. a wafer) to another substrate (e.g. wafer), each substrate comprising components that have been manufactured separately. In particular it relates to a method for integrating transducers on read-out-circuits (ROIC).

BACKGROUND OF THE INVENTION

In planar, wafer based mass production of IR detector matrices (hereinbelow referred to as "detectors") having read-out electronics (hereinbelow referred to as "IC" or "electronics"), two main principles have bee employed.

1. The IC is manufactured to a finished state, and then the detector is manufactured on the IC. The detectors are built onto the IC wafers, an advantage with this approach is that so called IC-foundries can be used, which represents a very cost efficient manufacturing of the electronics wafers. A disadvantage is that there is a very restricted selection of materials and methods that are usable for the manufacturing of the detectors, because there is an upper temperature limit of about 400° C., above which the electronic will be damaged. This makes the manufacturing of detectors having optimal performance more difficult.

2. Overlapping IC and detector manufacture. I.e., at the end of the process for making the IC, detector manufacture is started on the same wafers. The advantage with this approach is that there is a greater freedom of selecting materials, methods and temperatures for the manufacture of detectors having good performance. A disadvantage is that the IC wafers cannot be manufactured in standard IC foundries, because they have very strict demands on a the process of manufacturing to be standardized in order to be able to maintain the quality in the processes. An example of a prior art processes can be found in EP 0 534 768 A1 (Texas Instr.).

SUMMARY OF THE INVENTION

Thus, there is a demand for methods of manufacturing micro electric/mechanical/optical devices comprising at least two of components, wherein the two structures can be difficult to make in one and the same process if optimal performance of both structures in the final device are desired, and the object of the present invention is therefore to provide a process for the manufacture of integrated devices having a first structure (e.g. semi-conductor device) connected to a second structure (e.g. an electronic device).

In its most general aspect, the invention relates to a process for coupling or connecting a first structure with a second structure, wherein the key step involves the provision of a temporary adhesive layer between said structures, and wherein connections between the first and second structures are made while maintaining adhesion between the structures.

In a particular aspect, the invention relates to a process for the manufacture of an integrated device having a transducer coupled to a read-out electronic circuit (ROIC).

Thus, in a preferred embodiment, the first and second structures (which can be an electronic device and a detector respectively), are made separately on separate wafers, using methods optimally adapted for each, whereupon the detector wafers are attached and connected to the electronics (IC) wafers by the inventive process, involving joining and deposition techniques. With the method, large arrays of components can be made.

A great advantage with the inventive method is that the separate structures (detectors and electronics) can be manufactured separately without the over all process being limited by the process parameters for the manufacture of any of the devices. Another advantage is that unique layer sequences, heretofore unattainable can be achieved.

IR-detectors are commonly processed directly on a read-out-circuit (ROIC). Since the ROIC can only withstand temperatures of about 400–450° C. all such IR-detector production processes must be below this temperatures.

For a good performance of the detectors it is necessary to use thermistor materials with a high temperature coefficient and low noise. Some of the potential thermistor materials have better material properties when they are deposited at high temperatures (between 500 and 1000° C.). It could also be desired to make the temperature sensing part (thermistor material) of the detector out of a GaAs/AlGaAs epitaxial layer or other materials (for better functionality of the detectors due to better material properties). The epitaxial layer for example can only be deposited and patterned on a GaAs wafer, which requires a transferring technology from the GaAs wafer to the ROIC. Also monocrystaline silicon is due to its material properties potentially a good thermistor material. It is available in good quality only as a bulk material.

In general it is desired during the manufacturing of a IR-detector to have maximum freedom of choosing different materials for all parts of the detector. This is the most efficient way to optimise the different components of a detector.

The method according to the invention for transferring structures from one wafer to another, makes it possible to manufacture detectors or parts of them from materials that could not be used so far as detector materials.

BRIEF DESCRIPTION OF THE DRAWINGS

The invention will be described by exemplary embodiments thereof and with reference to the drawings, in which.

DETAILED DESCRIPTION OF EMBODIMENTS OF THE INVENTION

For the purposes of this application, the terms "wafer" and "substrate" are used interchangeably, the difference between them merely amounting to dimensions thereof. E.g a "wafer" could have any shape and thicknesses that still enables the method to be carried out.

"Component" shall be taken to mean any structure that is provided as a subunit on a wafer or substrate, and can comprise entire devices, as well as details of such devices, even a single piece of a material.

The method according to the present invention is particularly suited for the manufacturing of uncooled thermal infrared detectors (IR-detector), e.g bolometers. However, it would be applicable to a wide variety of thermal and non-thermal detector devices, such as, but not limited to, quantum well detectors, pyroelectric detectors, etc. It is particularly suitable when for some reason it is not possible to process/pattern/deposit a structure (e.g. a detector element) directly on a substrate, where another structure (e.g. read-out electronics) is present. This can e.g. be the case if the structure provided on said substrate, is temperature sensitive to the process temperature for the processing of the structure to be provided thereon.

Figure 1:
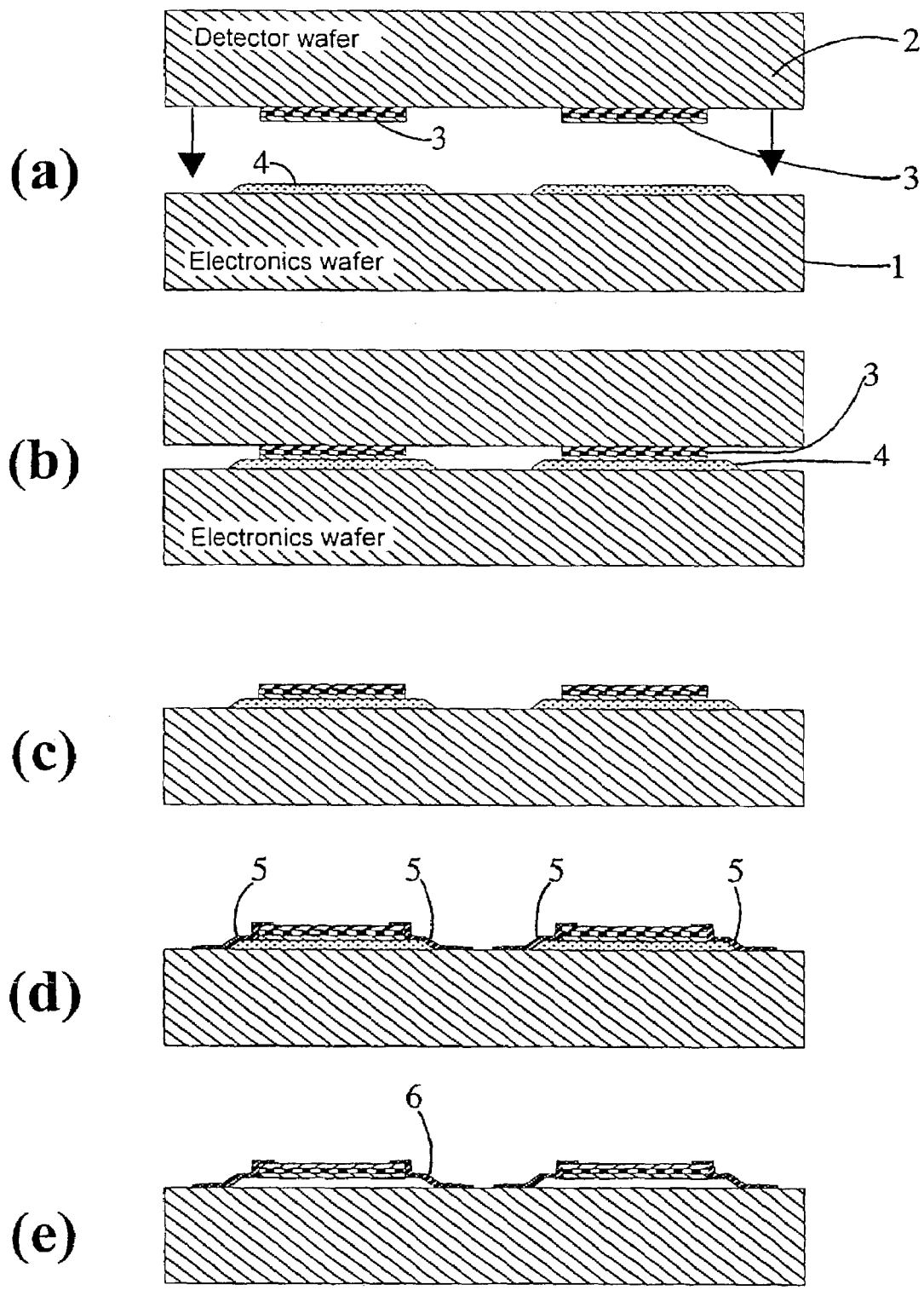
FIG. 1 illustrates a process according to the invention.

FIG. 1 illustrates schematically the inventive method in general terms. Thereby a first wafer 1 having read-out circuitry (and/or other types of circuitry) is manufactured by some standard type and cost efficient process, such as those methods commonly employed in ASIC production, or in "IC-foundries" (this does not form part of the invention per se). However, on these pre-made wafers there can been provided electrical contact surfaces or elements, by means of which a device or devices 3 (e.g. a detector or some other type of transducer in general; in the following reference will be made to "detectors" or "detector elements", but it is to be understood that it could be any other kind of electric/mechanical/optical device), provided on a second wafer 2, and to be integrated with the pre-made device are to be attached to the read-out electronic wafer, FIG. 1a).

The detector elements are manufactured on one side of a carrier substrate or wafer, preferably made of silicon, although other materials are possible, e.g. AlGaAs, glass, quartz, InP, SiC etc. Materials and process for each wafer are selected for the best possible performance of each part (selectivity, response times etc for detectors).

The electronics wafer is suitably coated with an uncured polymer layer 4. A suitable polymer is poly-imide, although other materials are possible too, for example epoxy, BCB (butylcyclobutene), photoresist, polyimide, low temperature adhesives in general. The polymer layer is suitably patterned.

The wafers (one carrying the electronics part, the other e.g. a detector element) are brought together under pressure and preferably with heating, FIG. 1b). Thus, the two wafers will be temporarily bonded together by the polymer layer, that functions as an adhesive. This procedure can be performed with standard equipment, which also enables alignment of wafers if needed. The detector wafer 2 of silicon is etched away, FIG. 1c), or removed in some other suitable way, such that only the actual detector elements remain. This can be done by wet etching, e.g. by using KOH, EDP, TMAH or grinding/polishing, just to mention a few possibilities, and the skilled man will find suitable techniques using his ordinary knowledge. Dry etching of e.g. RIE type can also be used. An etch stop layer may be needed on the silicon wafer such that the etch will not be brought in contact with the poly imide or the surface of the electronics of the electronic wafer. Connections, such as conductors 5 and support legs 6, are provided, FIG. 1d), and finally the polymer is optionally etched away, FIG. 1e), entirely or partially.

However, in some cases only part of the wafer is removed, either by pattering and/or by thinning to a desired thickness, and it is also possible to remove the other wafer.

Thus, in summary the method can be said to comprise the following key features:

A: Two wafers/substrates, in the following referred to as a "sacrificial wafer" (carrying the detector element), and "non-sacrificial wafer" (carrying ROIC), respectively are bonded with an intermediate bonding material.

B: The sacrificial wafer is (optionally) thinned to a certain level, such as by etching C: The remaining parts of the sacrificial wafer may be electrically interconnected to the component (s) on the non-sacrificial wafer via suitable.

D: Optionally, the intermediate bonding material (polymer) or parts of it is stripped away.

Below descriptions of a method to transfer structures or complete material films from one substrate to an other substrate (for example to a ROIC) will be given in the form of examples.

EXAMPLES

Figure 2:
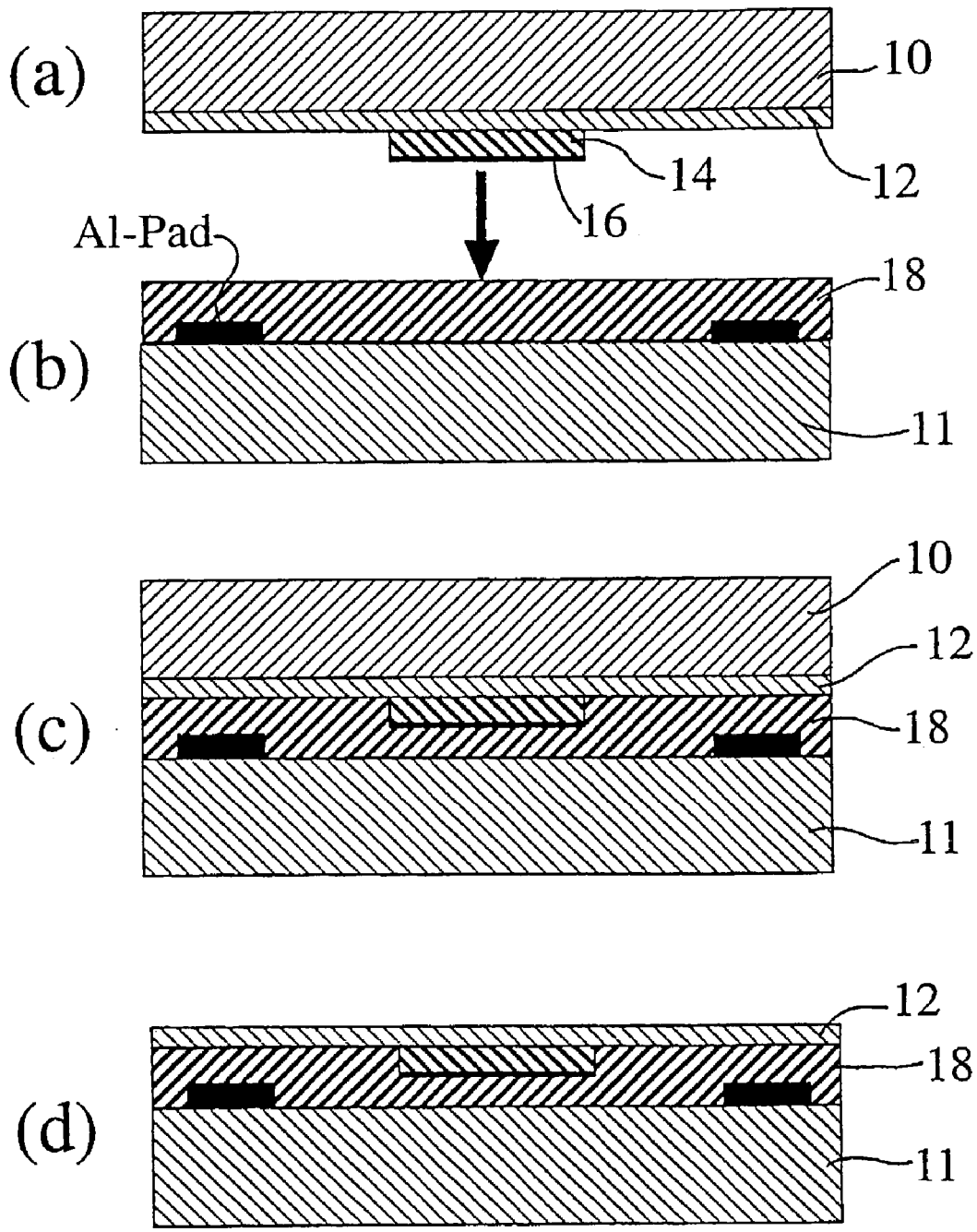
FIG. 2 illustrates a first embodiment of the method of the invention.
Figure 2:
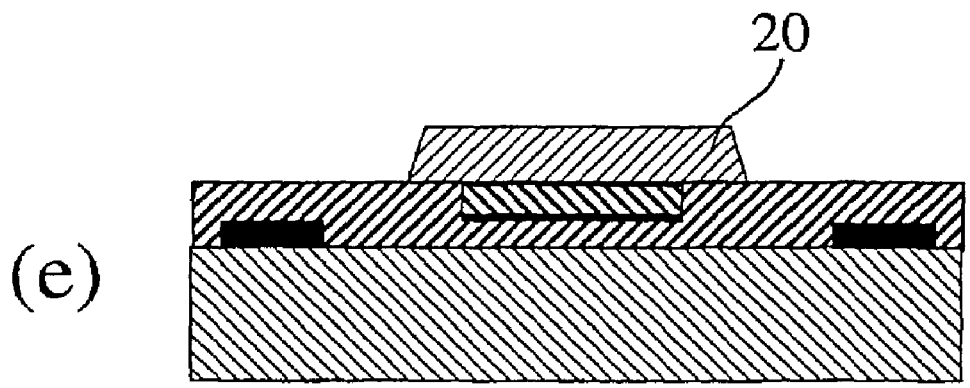
Figure 2:
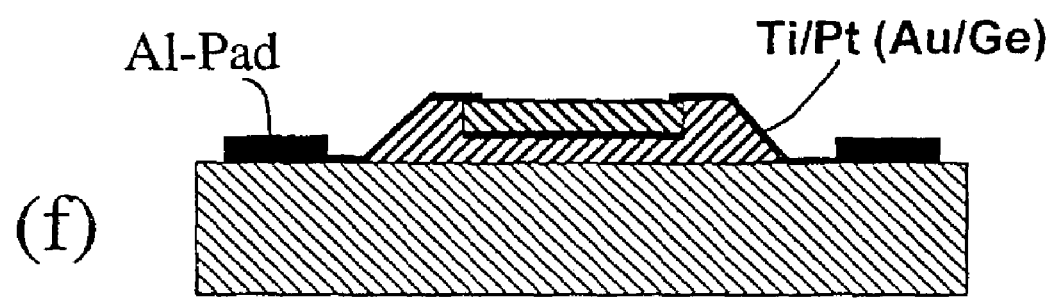
Figure 2:
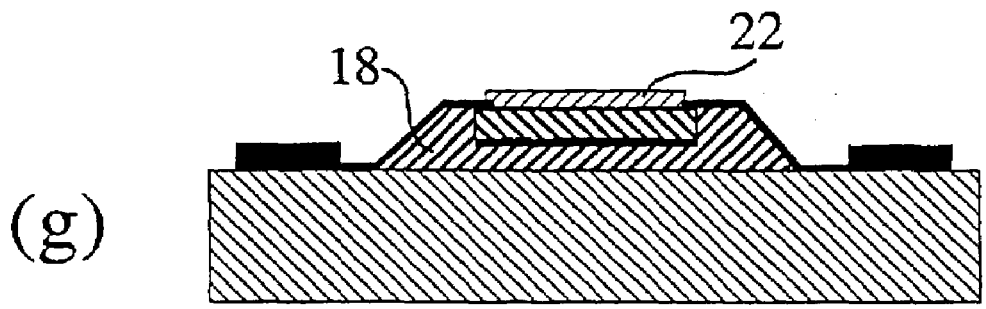
Figure 2:
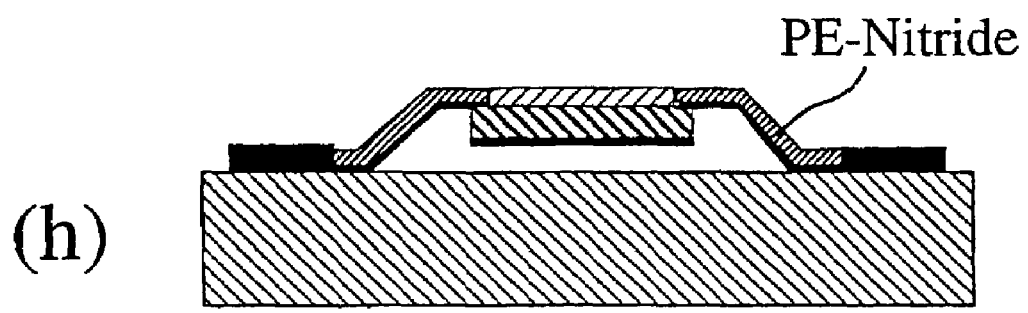
Figure 3:
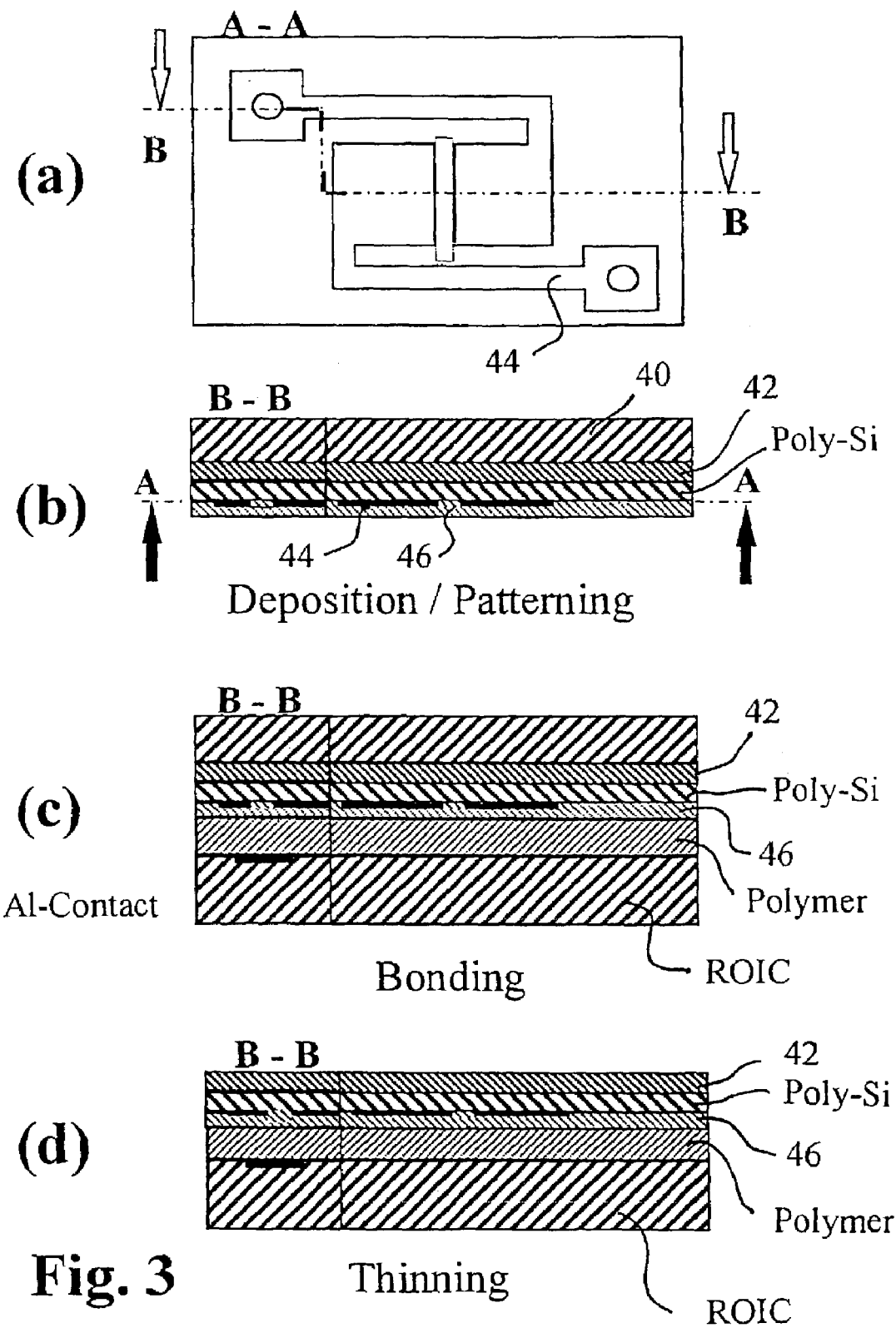
FIG. 3 illustrates a variation of the first embodiment of the method of the invention.
Figure 3:
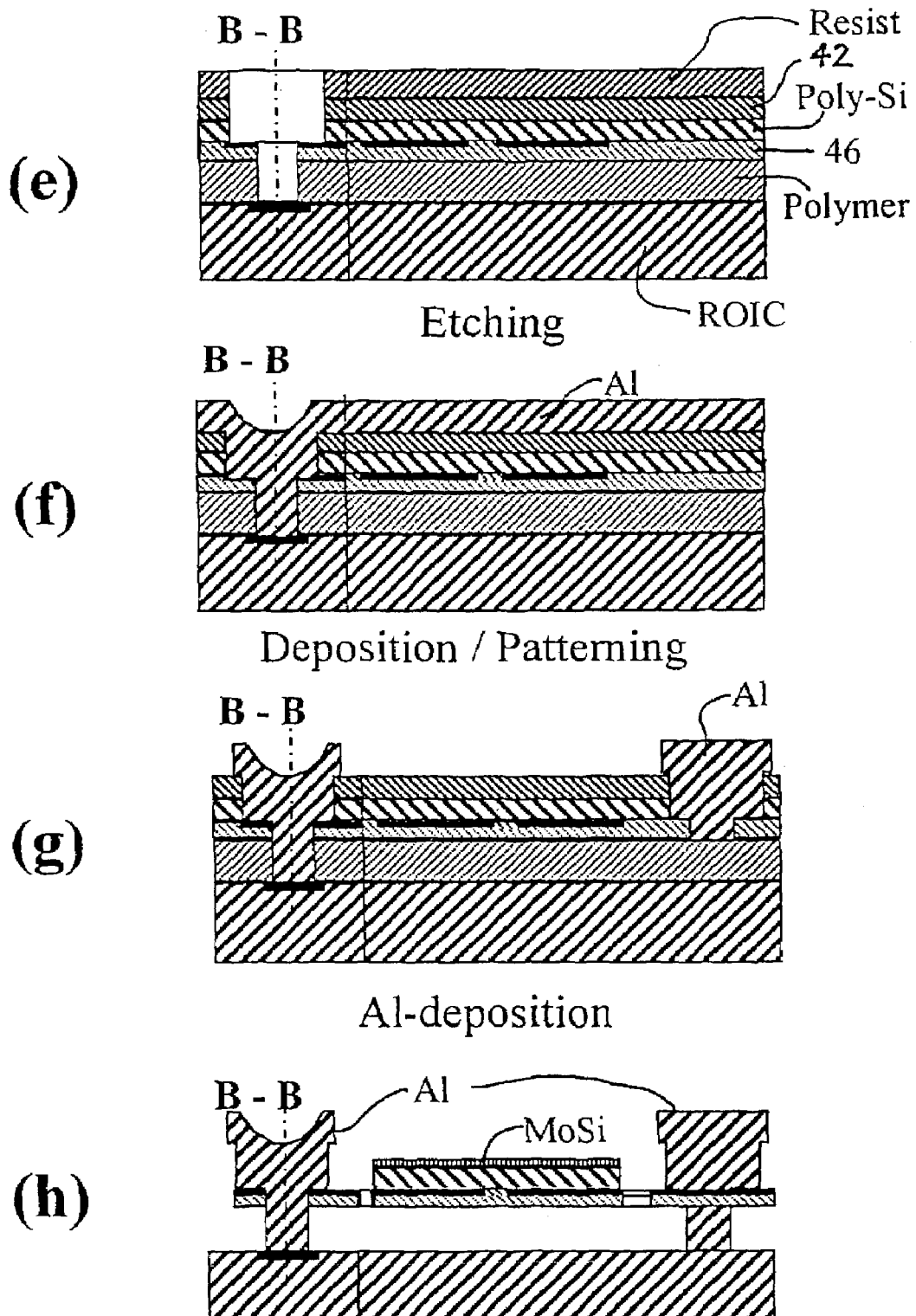

Example 1 (the Process of FIG. 2)

A silicon wafer 10 is oxidised in an oxidising furnace so that a 1 μm SiO2 layer 12 is produced on its surface. Then a poly-silicon layer 14 of 1 μm thickness is grown on the wafer in a high temperature furnace. A Ti/Pt (50/300–500 Å) layer 16 is deposited on the poly-silicon.

After that, photoresist is spun on the wafer and patterned with photolithography. Then, first the Ti/Pt and subsequently the poly-silicon is etched down to the SiO2 layer with deep reactive ion etching. After stripping of the photoresist the poly-silicon islands remain on the wafer surface (a). The poly-silicon and the SiO2 on the backside of the wafer is etched away with reactive ion etching, so that the backside material of the wafer will be only silicon bulk material. In a next step, first a bonding material 18, e.g. a photo resist, is spun on a ROIC wafer 11, and precured on a hotplate (60° C.) for about 5 min, (b). Then the two wafers are bonded together with a bonding pressure of about 1 bar in a vacuum (c). While applying the pressure the temperature of the wafer is ramped up to 350° C. for two hours to cure the polyimide. After this step the backside of the silicon wafer 10 is thinned down to the SiO2 layer, e.g. by deep reaction etching (d). The SiO2 layer is then etched with buffer HF (BHF). Then again photoresist is spun (e) on the remaining polyimide for patterning and etching the polyimide (plasma etch). The result of this process is to "open up" areas on the ROIC, and to obtain sloped walls in the polyimide (f). In the next step Ti/Pt is deposited as a contact metal between the ROIC and the poly-silicon islands (g). On top of this PE-silicon nitride is deposited to mechanically strengthen the structure (h). Then both the PESiN and the Ti/Pt is patterned and etched (standard method with photoresist), creating "leg-structures". As a final step the remaining polyimide (former bonding material) is stripped in an O2-plasma, resulting in a free hanging, highly thermally isolated bolometer. Optionally, after deposition of Ti/Pt an IR absorbing material 22 (e.g. molybdenum silicide) can be provided Example 2 (Process of FIGS. 3 4, 5 7, 8 and FIGS. 6, 7 11, 12)

FIG. 3(a) is a top view showing how the cross sections B—B in (b)–(d) are taken. A silicon wafer 40 is oxidised in an oxidising furnace so that a 1 μm SiO2 layer 42 is produced on its surface. Then a poly-silicon layer of 1 μm thickness is provided on the wafer. A Ti/Pt (50+300 Å) layer 44 is deposited on the poly-silicon and patterned with a so called lift-off (FIG. 3(b)). The structures of the Ti/Pt represents the bolometer structures including the bolometer legs. Then a layer 46 of 0.5 μm PE-SiN is deposited on top of the Ti/Pt and polysilicon.

Figure 4:
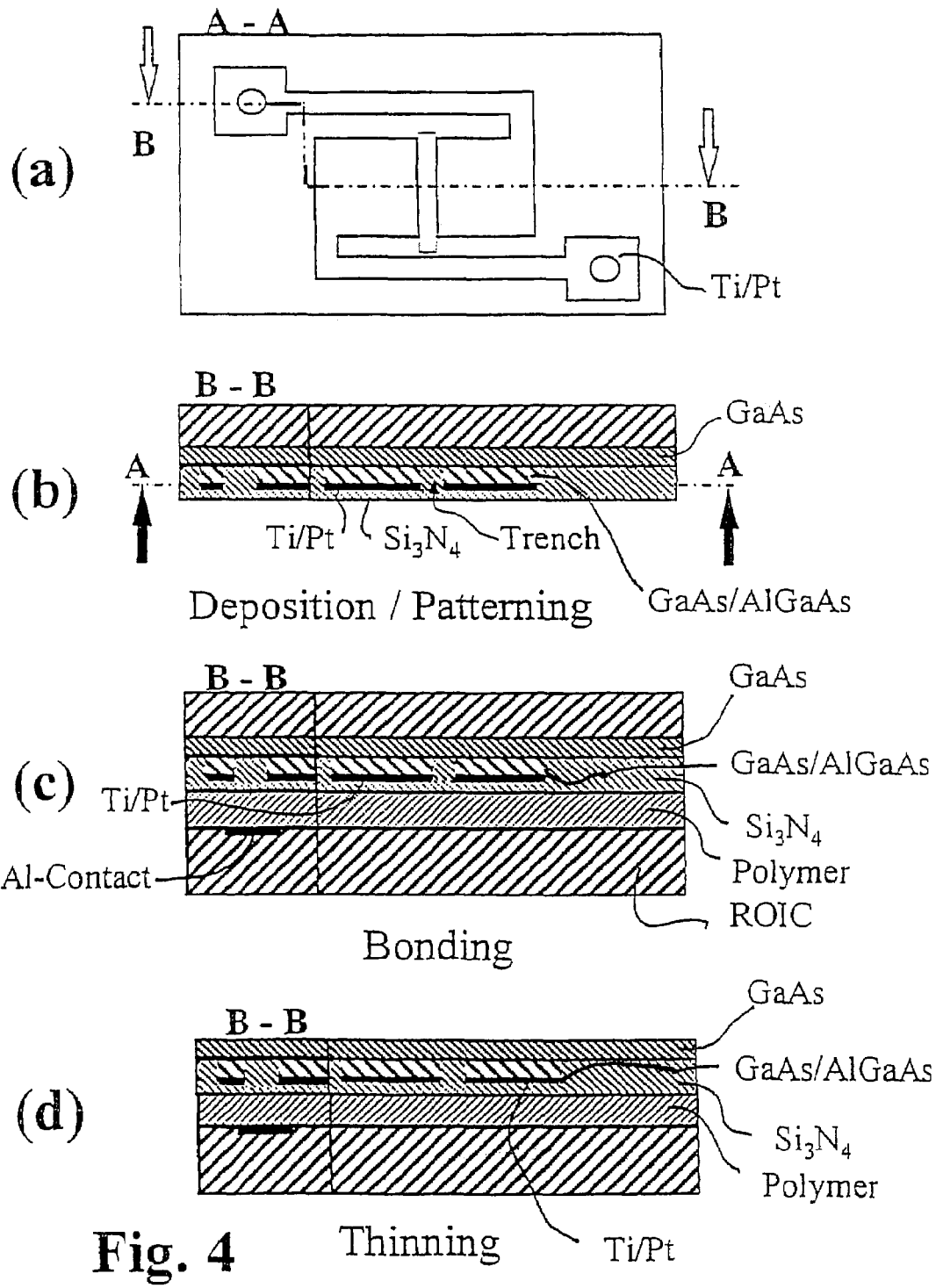
FIG. 4 illustrates a second embodiment of the method of the invention.
Figure 4:
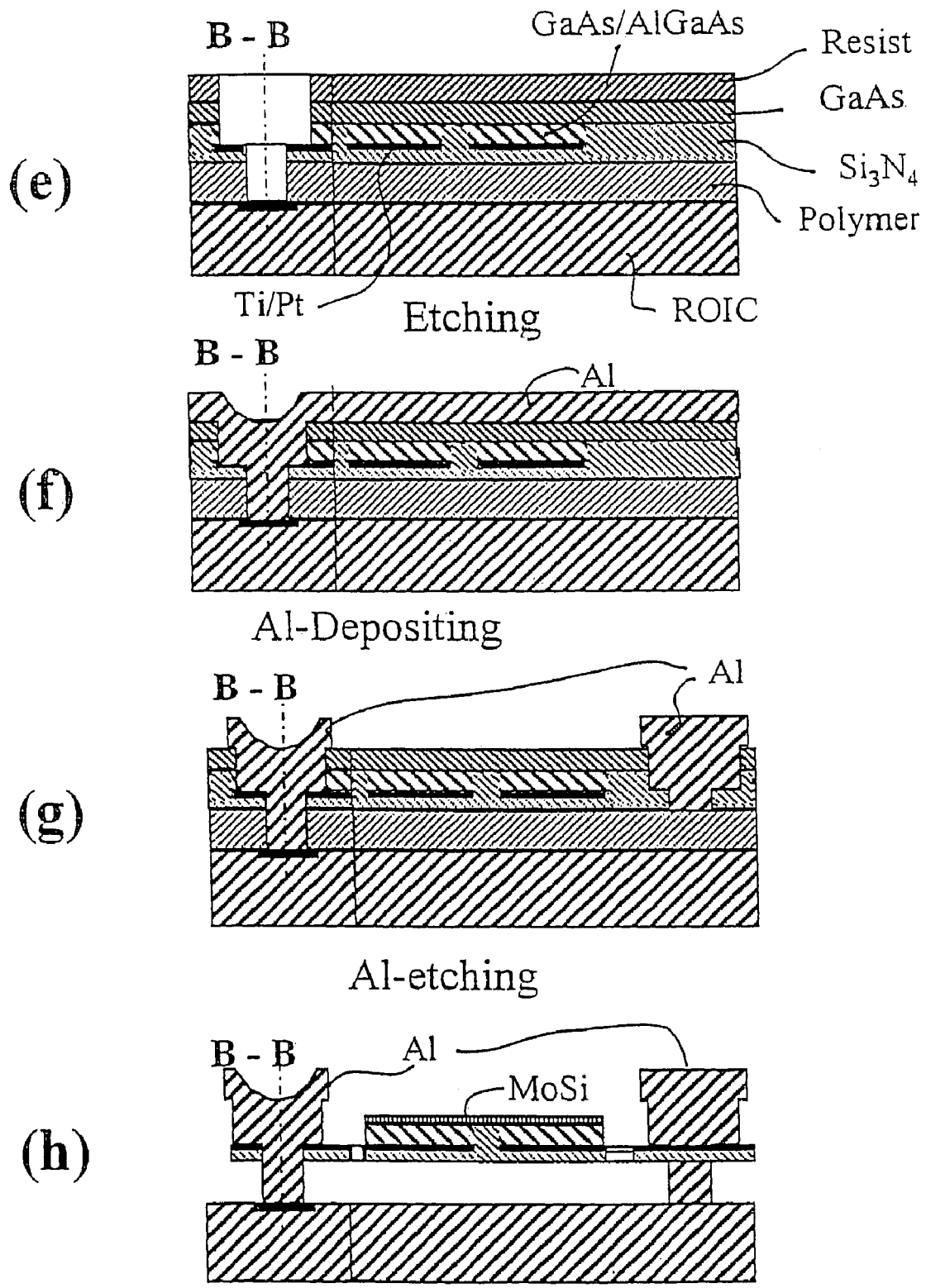

If for example AlGaAs is used instead of poly-silicon (FIG. 4 showing a similar sequence as in FIG. 3) there needs to be a trench 48, in the temperature sensing material because the resistance of AlGaAs is different in different directions inside the material. In that case the AlGaAs is etched down to the etch stop layer using the Ti/Pt as a mask, before depositing the PE-SiN.

The poly-silicon and the SiO2 on the backside of the wafer is etched with reactive ion etching so that the backside material of the wafer will be only silicon bulk material (b). In a next step first a bonding material is spun on a ROIC and precured on a hotplate (60° C.) for about 5 min. Then the two wafers are bonded together with a bonding pressure of about 1 bar in a vacuum (c). While applying the pressure the temperature of the wafer is ramped up to 350° C. for two hours to cure the polyimide. After this step the backside of the poly-silicon wafer is thinned down to the SiO2 layer (d).

Then again, photoresist is spun on the SiO2 layer for patterning and etching the SiO2, the poly-silicon and the bonding material (e). This opens up the areas over the Al-contacts on the ROIC (e). Depositing and patterning a layer of 4 µm of Al creates Al-pillars (f). These pillars form the electrical and mechanical contact between the ROIC and the bolometer/Ti/Pt-layer of the bolometer. The SiO2 layer is then etched with buffer HF (BHF) and the poly-silicon is patterned and etched (g). After etching the SiN, using the Ti/Pt structures as a mask a thin layer (100 Å) of molybdenum-silicide is deposited on the poly-silicon.

As a final step (h) the remaining polyimide (former bonding material) is stripped in an O2-plasma, ending up with a free hanging, highly thermally isolated bolometer.

Figure 5:
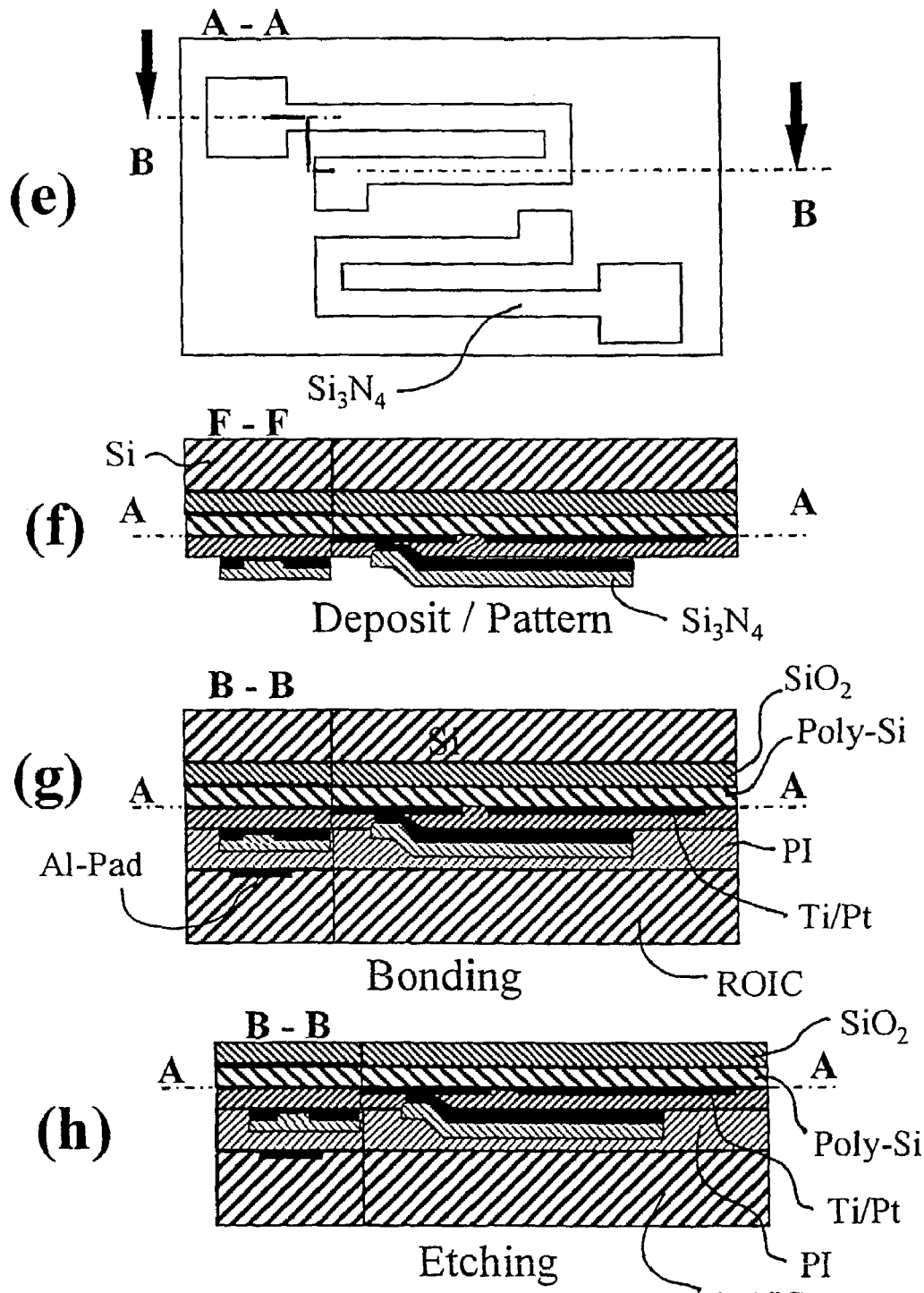
FIG. 5 illustrates a third embodiment of the method of the invention.

Example 3 (Process of FIG. 5)

A silicon wafer is oxidised in an oxidising furnace so that a 1 µm SiO2 layer is produced on is surface. Then a poly-silicon layer of 1 µm thickness is grown on the wafer in a high temperature furnace. The poly-silicon and the SiO2 on the backside of the wafer is etched with reactive ion etching so that the backside material of the wafer is silicon bulk material.

A Ti/Pt (50+300 Å) layer is deposited on the poly-silicon and patterned with a so called lift-off. The structures of the Ti/Pt represents the bolometer structures Then a 0.5–4 µm "sacrificial" layer of polyimide is spun on the wafer (on top of the Ti/Pt pattern) and cured.

Small areas of the polyimide are opened over the Ti/Pt structures. This is done in a way that the polyimide gets sloped walls on this openings. With an other lift-off a second layer of Ti/Pt is patterned on the polyimide representing the leg structures of the detector. The sloped walls of the polyimide guarantee good step-coverage and hence proper electrical contact between the two Ti/Pt layers. Next, a layer of SiN is deposited and patterned with the same structure as the Ti/Pt as mechanical support of the leg structures.

In a next step first a polyimide is spun on a ROIC and precured on a hotplate (60° C.) for about 5 min. Then the two wafers are bonded together with a bonding pressure of about 1 bar in a vacuum. While applying the pressure the temperature of the wafer is ramped up to 350° C. for two hours to cure the polyimide. After this step the backside of the poly-silicon wafer is thinned down to the SiO2 layer.

From here on the process of electrical and mechanical interconnection between the ROIC and the Ti/Pt layer (contacts) is basically the same as in the previous process sequence (Nr. 2). Photoresist is spun on the SiO2 layer for patterning and etching the SiO2, the poly-silicon and the polyimide. This opens up the areas over the Al-contacts on the ROIC. Depositing and patterning a layer of 4 µm of Al creates Al-pillars. This pillars are the electrical and mechanical contact between the ROIC and the bolometer/Ti/Pt-layer of the bolometer. The SiO2 layer is then etched with buffer HF (BHF) and the poly-silicon is patterned and etched. After etching the SiN, using the Ti/Pt structures as a mask a thin layer (100 Å) of molybdenum-silicide is deposited on the poly-silicon. As a final step all the remaining polyimide (both sacrificial polyimide layers) is stripped in an 02-plasma, ending up with a free hanging, highly thermally isolated bolometer. This design strategy, having the legs under the membrane allows to have a higher fill factor in detector arrays and still having very good thermally isolated bolometers, since the legs can be made very long, using all the space under the membrane.

Although the invention has been described with reference to specific examples, it is to be understood that it is only limited by the scope of the claims, and the skilled man will find numerous variations within said scope.

In particular the method can be repeated with several substrates, whereby very complex layered structures can be made, which have not been possible to make previously. Materials other than those specifically shown can be used, i. e. the sacrificial substrate can be mono-Si, poly-Si, SiC, GaAs, InP, various metals, practically any semi-conductor material etc.

What is claimed is:

1. A method of combining component(s) to form an integrated device, with said components provided on a sacrificial substrate and on a non-sacrificial substrate, respectively, and with component(s) transferred from the sacrificial substrate to the non-sacrificial substrate, comprising the following steps:

providing a non-sacrificial substrate having a first component provided thereon;

providing the non-sacrificial substrate with electrical contact surfaces or elements, by which surfaces or elements of a second component, provided on a sacrificial substrate and to be interconnected and integrated with the first component on the non-sacrificial substrate are to be attached to the non-sacrificial wafer;

providing a sacrificial wafer having the second component provided on one side thereof;

coating one of the sacrificial and the non-sacrificial substrate with an adhesive layer;

bonding the wafers together using the adhesive by bringing the wafers, carrying the first and second components together under pressure;

removing the substrate material of the sacrificial wafer such that only the actual second component thereon remains, thereby transferring the second component to the non-sacrificial substrate; and after the second component from the sacrificial substrate has been transferred to first component on the non-sacrificial substrate, providing connections, including conductors and support legs, connecting the first component on the non-sacrificial wafer with the second component from the sacrificial substrate, using deposition, patterning and etching procedures.

2. The method as claimed in claim 1, wherein the adhesive is etched away, entirely or partially.

3. The method as claimed in claim 1, further comprising stripping away the adhesive after the final structures have been obtained.

4. The method of claim 1, wherein the second component on said sacrificial substrate is a transducer, and the first component on said non-sacrificial layer is an electronic device.

5. The method of claim 1, wherein at least one of said substrates are provided with contact pads for said electrical interconnection.

6. The method of claim 1, wherein said interconnection is an electrical interconnection, such as conducting material provided between said first and second components.

7. The method of claim 1, wherein said intermediate bonding material is a low temperature adhesive selected from the group comprising a polymer selected from polyimide, bensocyclobutene (BCB), epoxy, and photoresist.

8. The method of claim 5, wherein said transducer is selected from the group consisting of IR detectors, RF devices and optical devices.

9. The method of claim 8, wherein the IR detectors are selected from the group consisting of a bolometer, a quantum well detector, and a pyroelectric detector.

10. The method of claim 1, wherein said removal of the sacrificial substrate is thinning performed by mechanical means or by etching away part of or the entire substrate, or a combination of both.

11. The method of claim 1, wherein said intermediate bonding is provided only on parts of said substrate(s).

12. The method of claim 1, wherein said first and second components are micro electronic structures having at least one contact point each between which to establish said interconnection.

13. The method of claim 12, wherein portions of said intermediate polymer layer are selectively removed such that said contact points are exposed.

14. The method of claim 1, wherein the transfer of components comprises transfer of material films or layers.

15. The method as claimed in claim 1, wherein the adhesive layer is patterned.

16. The method fo claim 4, wherein the first component is a read-out device (ROIC).

17. A method of combining components to form an integrated device, wherein said components are provided on a first sacrificial substrate and on a second non-sacrificial substrate, respectively, comprising the following steps:
   oxidizing a sacrificial semiconductor wafer so that an oxide layer is produced on a surface thereof;
   growing a poly-silicon layer on the wafer;
   depositing a Ti/Pt layer on the poly-silicon;
   spinning photoresist on the wafer and patterning with photolithography;
   etching first the Ti/Pt and subsequently the poly-silicon down to the oxide layer;
   stripping of the photoresist to leave poly-silicon islands on the wafer surface;
   etching away the poly-silicon and the oxide layer on the backside of the wafer;
   spinning a bonding material on a non-sacrificial (ROIC) wafer;
   bonding the two wafers together under pressure;
   thinning the backside of the sacrificial silicon wafer down to the oxide layer;
   etching the oxide layer;
   spinning photoresist on the remaining bonding material for patterning and etching the bonding material to open up areas on the non-sacrificial wafer and to obtain sloped walls in the polyimide;
   depositing Ti/Pt as a contact metal between the non-sacrificial wafer and the poly-silicon islands;
   patterning and etching to create leg-structures;
   stripping the remaining bonding material, to provide a free hanging, highly thermally isolated device.

18. The method as claimed in claim 17, comprising depositing PECVD-silicon nitride on top of the polysilicon islands to mechanically strengthen the structure.

19. The method as claimed in claim 1, wherein the components on the sacrificial wafer comprises a material selected from the group consisting of mono-Si, poly-Si, SiC, GaAs, InP.

20. A method of combining components to form an integrated device, wherein said components are provided on a first sacrificial substrate and a second non-sacrificial substrate, respectively, comprising the following steps:
   oxidizing a sacrificial semiconductor wafer so that an oxide layer is produced on a surface thereof;
   growing a poly-silicon layer on the wafer;
   etching the poly-silicon and the oxide on the backside of the wafer so that the backside material of the wafer is silicon bulk material;
   depositing a Ti/Pt layer on the poly-silicon;
   patterning the Ti/Pt layer to form Ti/Pt structures;
   spinning a sacrificial layer of polyimide on the wafer on top of the Ti/Pt pattern and curing;
   opening up small areas of the polyimide over the Ti/Pt structures to provide sloped walls on these openings;
   patterning a second layer of Ti/Pt on the polyimide to represent leg structures of a detector;
   depositing a layer of SiN and patterning the SiN layer with the same structure as the Ti/Pt layer as a mechanical support of the leg structures;
   spinning a polyimide on a non-sacrificial wafer (ROIC);
   bonding the two wafers together applying pressure;
   thinning the backside of the poly-silicon wafer down to the oxide layer;
   spinning photoresist on the oxide layer for patterning and etching the oxide, the poly-silicon and the polyimide to open up areas on the non-sacrificial wafer;
   depositing and patterning a layer of Al to create Al-pillars, forming electrical and mechanical contact between the non-sacrificial wafer and the detector;
   etching the oxide layer with buffer HF (BHF);
   patterning and etching the poly-silicon;
   etching the SiN;
   depositing a thin layer of molybdenum-silicide on the poly-silicon using the Ti/Pt structures as a mask;
   stripping off all the remaining polyimide (both sacrificial polyimide layers), to provide a free hanging, highly thermally isolated device.

* * * * *